(12) United States Patent
Cheng

(10) Patent No.: US 11,876,129 B2
(45) Date of Patent: Jan. 16, 2024

(54) SEMICONDUCTOR STRUCTURE AND MANUFACTURING METHOD FOR THE SEMICONDUCTOR STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 681 days.

(21) Appl. No.: 17/086,688

(22) Filed: Nov. 2, 2020

(65) Prior Publication Data

US 2021/0050437 A1 Feb. 18, 2021

Related U.S. Application Data

(63) Continuation of application No. PCT/CN2019/079741, filed on Mar. 26, 2019.

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0254* (2013.01); *H01L 21/02579* (2013.01);
(Continued)

(58) Field of Classification Search
None
See application file for complete search history.

(56) References Cited

U.S. PATENT DOCUMENTS

| 9,337,278 | B1* | 5/2016 | Gu | H01L 24/83 |
| 2019/0081165 | A1* | 3/2019 | Huang | H01L 29/51 |

(Continued)

FOREIGN PATENT DOCUMENTS

| CN | 101355129 A | 1/2009 |
| CN | 104051522 A | 9/2014 |

(Continued)

OTHER PUBLICATIONS

Hao, Yue et al., Chapter 8, Section 8.1, Analysis of GaN Dislocation Type and Density by Corrosion Method, Nitride Wide Bandgap Semiconductor Material and Electronic Device, Jan. 13, 2013, p. 148, Science Press, China.

(Continued)

*Primary Examiner* — Michael Lebentritt
(74) *Attorney, Agent, or Firm* — Westbridge IP LLC

(57) ABSTRACT

Embodiments of the present application disclose a semiconductor structure and a manufacturing method for the semiconductor structure, which solve problems of complicated manufacturing process and poor stability and reliability of existing semiconductor structures. The semiconductor structure includes: a substrate; a channel layer and a barrier layer sequentially superimposed on the substrate, wherein the channel layer and the barrier layer are made of GaN-based materials and an upper surface of the barrier layer is Ga-face; and a p-type GaN-based semiconductor layer formed in a gate region of the barrier layer. An upper surface of the p-type GaN-based semiconductor layer is N-face.

14 Claims, 7 Drawing Sheets

(51) Int. Cl.
*H01L 21/285* (2006.01)
*H01L 21/306* (2006.01)
*H01L 29/15* (2006.01)
*H01L 29/20* (2006.01)
*H01L 29/205* (2006.01)
*H01L 29/207* (2006.01)
*H01L 29/423* (2006.01)
*H01L 29/66* (2006.01)

(52) U.S. Cl.
CPC .. *H01L 21/28581* (2013.01); *H01L 21/30612* (2013.01); *H01L 29/157* (2013.01); *H01L 29/2003* (2013.01); *H01L 29/205* (2013.01); *H01L 29/207* (2013.01); *H01L 29/42316* (2013.01); *H01L 29/66462* (2013.01)

(56) References Cited

U.S. PATENT DOCUMENTS

| | | | | |
|---|---|---|---|---|
| 2019/0267470 A1* | 8/2019 | Ni | ...................... | H01L 21/02458 |
| 2022/0029007 A1* | 1/2022 | Chen | .................. | H01L 29/2003 |
| 2022/0093780 A1* | 3/2022 | Huang | ................ | H01L 29/0657 |
| 2023/0154785 A1* | 5/2023 | Cheng | ..................... | C30B 25/18 |
| | | | | 257/76 |
| 2023/0178611 A1* | 6/2023 | Raring | .................. | H01L 27/088 |
| | | | | 438/31 |
| 2023/0238446 A1* | 7/2023 | Cheng | ................... | H01L 21/764 |
| | | | | 257/183 |

FOREIGN PATENT DOCUMENTS

| | | | | | |
|---|---|---|---|---|---|
| CN | 105655395 A | | 6/2016 | | |
| CN | 106206295 A | | 12/2016 | | |
| CN | 106847668 A | | 6/2017 | | |
| CN | 112490280 A | * | 3/2021 | ......... | H01L 21/8252 |
| WO | WO-2017153911 A1 | * | 9/2017 | ........... | A61B 1/2736 |
| WO | WO-2020222149 A1 | * | 11/2020 | | |

OTHER PUBLICATIONS

International Search Report in corresponding PCT Application No. PCT/CN2019/079741, dated Dec. 27, 2019.
Written Opinion in corresponding PCT Application No. PCT/CN2019/079741, dated Dec. 27, 2019.
Second Office Action issued in counterpart Chinese Patent Application No. 201980094435.8, dated Oct. 26, 2023.

* cited by examiner

SEMICONDUCTOR STRUCTURE AND MANUFACTURING METHOD FOR THE SEMICONDUCTOR STRUCTURE

CROSS-REFERENCE TO RELATED APPLICATIONS

The present application is a continuation of International Application No. PCT/CN2019/079741 filed on Mar. 26, 2019, which is incorporated herein in its entirety by reference.

TECHNICAL FIELD

The present application relates to the field of microelectronics technologies, in particular to a semiconductor structure and a manufacturing method for the semiconductor structure.

BACKGROUND

A High Electron Mobility Transistor (HEMT) is a heterostructure field effect transistor. Taking an AlGaN/GaN heterostructure as an example, due to a strong two-dimensional electron gas in AlGaN/GaN heterostructure, an AlGaN/GaN HEMTs is usually a depletion-mode device, which makes an enhancement-mode device difficult to achieve. In many respects, applications of depletion-mode devices have certain limitations. For example, in the application of power switching devices, enhancement-mode (normally-off) switching devices are required. Enhancement-mode GaN switching devices are mainly used in high-frequency devices, power switching devices and digital circuits, etc., and research for it is of great significance.

In order to realize an enhancement-mode GaN switching device, it is necessary to find a suitable method to reduce concentration of carriers in a channel under a gate when the gate voltage is zero, for example, a method of disposing a p-type semiconductor material in a gate region. However, the inventor found that this method has at least the following defects:

Disposing a p-type semiconductor material in the gate region requires selective etching of p-type semiconductors in other regions other than the gate region, and precise process control of an etching thickness in an epitaxial direction is very difficult. It is very easy to overetch the p-type semiconductor and etch semiconductor materials below it, and the defects caused by the etching may cause serious current collapse effect, and affect the stability and reliability of the device.

SUMMARY

In view of this, the present application provides a semiconductor structure and a manufacturing method for the semiconductor structure, which solves problems of complicated manufacturing process and poor stability and reliability of existing semiconductor structures.

The present application provides a manufacturing method for a semiconductor structure, which includes: a substrate; a channel layer and a barrier layer sequentially superimposed on the substrate, wherein the channel layer and the barrier layer are made of GaN-based materials and an upper surface of the barrier layer is Ga-face; and a p-type GaN-based semiconductor layer formed in a gate region of the barrier layer. An upper surface of the p-type GaN-based semiconductor layer is N-face.

The GaN-based materials described in embodiments of the present application refer to semiconductor materials based on Ga element and N element, such as materials of AlGaN, AlInGaN, GaN, etc.

In an embodiment, the channel layer may be made of GaN, and the barrier layer may be made of AlGaN.

In an embodiment, the semiconductor structure further includes: a gate electrode disposed on the p-type GaN-based semiconductor layer; a source electrode disposed in a source region of the barrier layer; and a drain electrode disposed in a drain region of the barrier layer.

In an embodiment, the semiconductor structure further includes: a nucleation layer between the channel layer and the substrate; and a buffer layer between the nucleation layer and the channel layer.

In an embodiment, the p-type GaN-based semiconductor layer includes a multilayer structure or a superlattice structure including one or more materials of p-type AlGaN, p-type GaN, and p-type InGaN.

In an embodiment, the semiconductor structure further includes a groove disposed in the gate region of the barrier layer, wherein the groove penetrates the barrier layer and stops on the channel layer or partially penetrates the barrier layer and stops in the barrier layer.

The present application provides a manufacturing method for a semiconductor structure, which includes following steps:

preparing a channel layer and a barrier layer sequentially superimposed on a substrate, wherein the channel layer and the barrier layer are made of GaN-based materials and an upper surface of the barrier layer is Ga-face; and preparing a p-type GaN-based semiconductor layer of GaN-based material with N-face as an upper surface above the barrier layer.

In an embodiment, the preparing a p-type GaN-based semiconductor layer of GaN-based material with N-face as an upper surface above the barrier layer, includes: preparing a p-type Ga-face GaN-based material above the barrier layer, and doping a polarity reversal element in the p-type Ga-face GaN-based material to reverse the p-type Ga-face GaN-based material to the p-type GaN-based semiconductor layer of GaN-based material with N-face as an upper surface.

In an embodiment, the polarity reversal element includes Mg.

In an embodiment, the preparing a p-type GaN-based semiconductor layer of GaN-based material with N-face as an upper surface above the barrier layer, includes: preparing a p-type Ga-face GaN-based material above the barrier layer; and reversing the p-type Ga-face GaN-based material by a polarity reversal layer to the p-type GaN-based semiconductor layer of GaN-based material with N-face as an upper surface.

In an embodiment, the preparing a p-type GaN-based semiconductor layer of GaN-based material with N-face as an upper surface above the barrier layer, includes: bonding the p-type GaN-based semiconductor layer with N-face as an upper surface to the barrier layer directly.

In an embodiment, the manufacturing method for a semiconductor structure further includes: etching the p-type GaN-based semiconductor layer selectively, and reserving only a portion of the p-type GaN-based semiconductor layer corresponding to a gate region.

In an embodiment, the manufacturing method for a semiconductor structure further includes: preparing a gate electrode on the p-type Ga-based semiconductor layer, preparing a source electrode in a source region of the barrier layer, and preparing a drain electrode in a drain region of the barrier layer.

In an embodiment, the manufacturing method for a semiconductor structure further includes: forming a nucleation layer and a buffer layer on the substrate sequentially before forming the channel layer.

In an embodiment, before the preparing a p-type GaN-based semiconductor layer with an N-face as an upper surface above the barrier layer, the manufacturing method for a semiconductor structure further includes: preparing a groove in a gate region of the barrier layer, wherein the groove penetrates the barrier layer and stops on the channel layer or partially penetrates the barrier layer and stops in the barrier layer.

According to a semiconductor structure and a manufacturing method for the semiconductor structure provided by the embodiments of the present application, a p-type GaN-based semiconductor layer is formed in a gate region on a barrier layer to achieve a purpose of pinching off an n-type conductive layer under a gate, thereby realizing the semiconductor structure. More importantly, because an N-face p-type GaN-based material has a characteristic of easy corrosion, an etching process is easy to control, a process difficulty of selective etching of the p-type semiconductor material in the gate region is reduced, and the stability and the reliability of a device are improved simultaneously. In the gate region, a high quality schottky gate may be achieved by using different metals and adjusting a work function. In addition, it is also possible to achieve Mg doping with high doping concentration on a surface of N-face p-type GaN of the gate, thereby achieving ohmic contact.

DETAILED DESCRIPTION OF THE EMBODIMENTS

The technical schemes of the present application will be described in detail below in combination with specific embodiments shown in the accompanying drawings. However, it cannot consider that these embodiments constitute a limitation to the scope of the present application. It should be noted that, and all these structural, method, or functional changes made by those of ordinary skill in the art according to these embodiments fall into the protection scope of the present application.

In addition, repeated reference numbers or labels may be used in different embodiments. These repetitions are only to briefly and clearly describe the present application, and do not represent any correlation between the different embodiments and/or structures discussed.

A manufacturing method for a semiconductor structure according to an embodiment of the present application includes following steps.

Figure 1A:
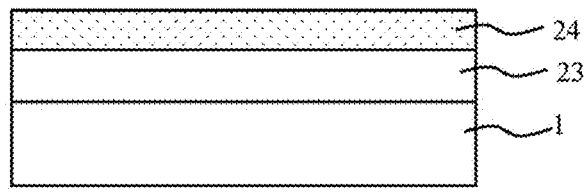
FIGS. 1a, 2, 3a, 3b, 4a, 4b, 4c, 5a, 5b, 6a, 6b, 6c, 6d and 6e are decomposition schematic diagrams illustrating a semiconductor structure in preparation processes respectively according to an embodiment of the present application.

Step 601: as shown in FIG. 1a, preparing a channel layer 23 and a barrier layer 24 sequentially superimposed on a substrate 1. The barrier layer 24 is made of a GaN-based material and an upper surface (a surface away from the substrate) of the barrier layer 24 is Ga-face.

In an embodiment of the present application, the channel layer 23 may also be made of a GaN-based material, and further, it may also be made of a Ga-face GaN material.

The GaN-based materials described in the embodiments of the present application refer to semiconductor materials based on Ga element and N element, such as materials of AlGaN, AlInGaN, GaN, etc.

The channel layer 23 and the barrier layer 24 may preferably be prepared by a process of Metal-Organic Chemical Vapor Deposition (MOCVD). Of course, this present application is not limited to this. They may also be prepared by Molecular Beam Epitaxy (MBE), Hydride Vapor Phase Epitaxy (HVPE), Physical Vapor Deposition (PVD), Atomic Layer Deposition (ALD), Chemical Vapor Deposition (CVD) and other preparation methods.

Figure 1B:
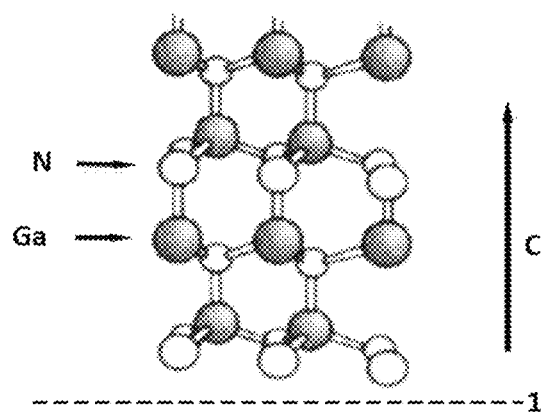
FIG. 1b is a schematic diagram of an atomic structure of Ga-face GaN.
Figure 1C:
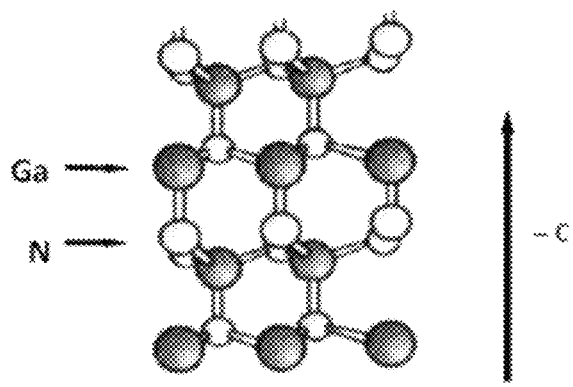
FIG. 1c is a schematic diagram of an atomic structure of N-face GaN.

FIG. 1b is a schematic diagram of an atomic structure of Ga-face GaN, and FIG. 1c is a schematic diagram of an atomic structure of N-face GaN. Regarding Ga-face GaN, taking a Ga—N bond parallel to a C axis as a reference, Ga atoms in each Ga—N bond are closer to the substrate 1, which is Ga-face GaN. Conversely, taking a Ga—N bond parallel to a C axis as a reference, if N atoms in each Ga—N bond are closer to the substrate 1, it is N-face GaN. For a same GaN-based semiconductor layer, N-face GaN is obtained by reversing the Ga-face GaN in FIG. 1b. A side far from the substrate shown in FIG. 1b is defined as Ga-face, the side far from the substrate shown in FIG. 1c is defined as N-face, and the Ga-face corresponds to the N-face. Since Ga-face GaN and N-face GaN have different atomic arrangements on a side of themselves away from the substrate, their characteristics are also different.

The channel layer 23 and barrier layer 24 mentioned above are prepared on the substrate 1. The substrate 1 may be selected from semiconductor materials, ceramic materials, or polymer materials. For example, the substrate 1 is preferably selected from sapphire, diamond, silicon carbide, silicon, lithium niobate, Silicon on Insulator (SOI), gallium nitride, or aluminum nitride.

The channel layer 23 and the barrier layer 24 may be made of semiconductor materials that can form a two-dimensional electron gas. For example, the channel layer 23 may be made of GaN, the barrier layer 24 may be made of AlGaN, and the channel layer 23 and the barrier layer 24 form a heterostructure to form a two-dimensional electron gas.

Figure 2:
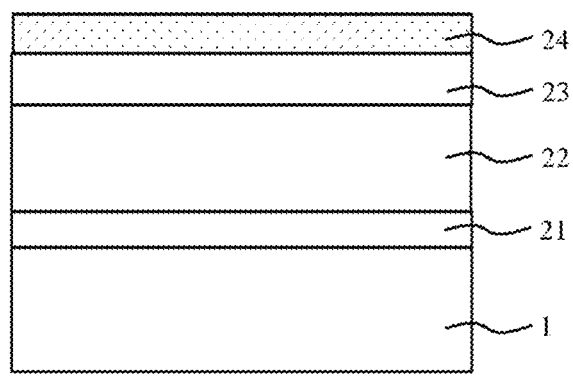

In an embodiment of the present application, as shown in FIG. 2, in order to improve device performances and meet related technical requirements, the semiconductor structure may further include a nucleation layer 21 and a buffer layer 22 provided between the substrate 1 and the channel layer 23. Taking a GaN-based semiconductor structure as an example, in order to meet technical requirements such as reducing dislocation density and defect density, and improving crystal quality, a nucleation layer 21 prepared above the substrate 1 may be further included. The nucleation layer 21 may be made of one or more materials of AlN, AlGaN and GaN. In addition, in order to buffer a stress in an epitaxial structure above the substrate and prevent the epitaxial structure from cracking, the GaN-based semiconductor structure may further include a buffer layer 22 prepared above the nucleation layer 21. The buffer layer 22 may be made of one or more of GaN, AlGaN, and AlInGaN. The present application does not specifically limit the arrangements of the nucleation layer 21 and the buffer layer 22.

In this embodiment, only the upper surface (the surface away from the substrate) of the barrier layer 24 is defined as the Ga-face, that is, the whole of the barrier layer 24 may be a Ga-face GaN-based material, or only an upper part of the barrier layer 24 away from the substrate is a Ga-face GaN-based material. In another embodiment, the channel layer 23 may be further defined as a Ga-face GaN-based material.

Figure 3A:
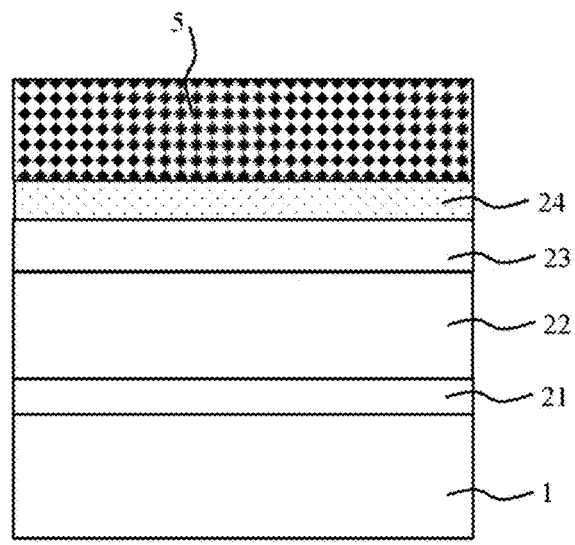

Step 602: as shown in FIG. 3a, preparing a p-type GaN-based semiconductor layer 5 above the barrier layer 24, an upper surface of the p-type GaN-based semiconductor layer 5 being N-face.

In the above step, preparing the p-type GaN-based semiconductor layer 5 with N-face as an upper surface above the barrier layer 24 may be implemented by various methods.

In an embodiment, during preparing the p-type GaN-based semiconductor layer 5 of GaN-based material with N-face as an upper surface on the barrier layer 24, a p-type Ga-face GaN-based material may be epitaxially grown first, and a polarity reversal element can be added at the same time as the epitaxial growth. The polarity reversal element may be, for example, Mg, etc., so that the Ga-face GaN-based material may become the N-face GaN-based material. Furthermore, when the barrier layer 24 and the p-type GaN-based semiconductor layer 5 are prepared, they may be epitaxially grown continuously. After the Ga-face barrier layer 24 is prepared, the GaN-based material may be reversed from the Ga-face to the N-face by adding the polarity reversal element. In this embodiment, a process of changing the Ga-face to the N-face by adding a polarity reversal element may include a transition process, so a lower surface of the p-type GaN-based semiconductor layer 5 close to the barrier layer 24 may be the Ga-face. However, a thickness of the Ga-face GaN contained in the p-type GaN-based semiconductor layer 5 does not exceed 120 nm, preferably it may be controlled below 40 nm, and even more preferably it may be less than 15 nm. When a lower surface of the p-type GaN-based semiconductor layer 5 close to the barrier layer 24 is a Ga-face, a remaining Ga-face GaN that is not etched away may not have a significant impact on the overall performance of the device due to its thin thickness.

Figure 3B:
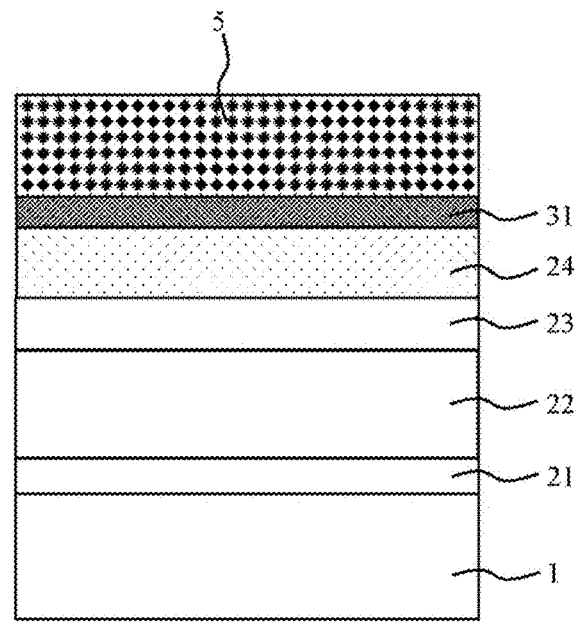

In an embodiment, the p-type GaN-based semiconductor layer 5 with N-face as an upper surface is prepared on the barrier layer 24, as shown in FIG. 3b, and during the epitaxial growth process, a polarity reversal layer 31 is prepared on the Ga-face barrier layer 24 to achieve polarity reversal, thereby achieving the preparation of the N-face p-type GaN-based semiconductor layer 5. Specifically, when the barrier layer 24 and the p-type GaN-based semiconductor layer 5 are prepared, they may be epitaxially grown continuously. After the Ga-face barrier layer 24 is prepared, the polarity reversal layer 31 can be prepared, so that the GaN-based material may be reversed from the Ga-face to the N-face. In this embodiment, a lower surface of the p-type GaN-based semiconductor layer 5 close to the barrier layer may also be N-face. For example, the polarity reversal layer 31 may be $Al_2O_3$. In addition, when the polarity reversal layer 31 is $Al_2O_3$, it may also prevent etching, and when the p-type GaN-based semiconductor layer 5 is etched, the etching may be stopped on the polarity reversal layer 31.

In an embodiment, the preparing the p-type GaN-based semiconductor layer 5 of GaN-based material with N-face as an upper surface above the barrier layer 24, may include bonding the p-type GaN-based semiconductor layer 5 with N-face on the barrier layer 24 directly.

In an embodiment of the present application, for example, the p-type GaN-based semiconductor layer 5 may be made of one or more of the following materials: p-type AlGaN, p-type GaN, and p-type InGaN.

Figure 4A:
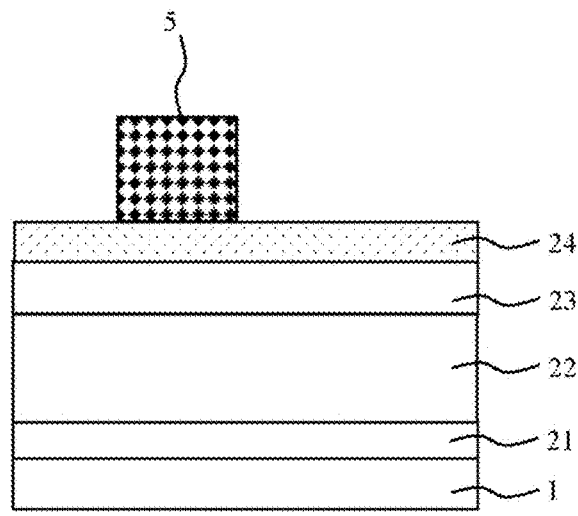

Step 603: as shown in FIG. 4a, etching the p-type GaN-based semiconductor layer 5 selectively, and reserving only a portion of the p-type GaN-based semiconductor layer corresponding to a gate region.

The gate region in the present application is a region used to prepare a gate. It should be understood by those skilled in the art that the gate region may be defined and determined according to a design and process of relevant devices.

In an embodiment of the present application, the selective etching process for the p-type GaN-based semiconductor layer 5 may be a wet etching process, for example, a wet etching process adopting KOH.

In wet etching, N-face GaN-based materials are easy to be etched, while Ga-face GaN-based materials are not easy to be etched. Therefore, in a process of etching the N-face GaN-based material, the etching process may be easily controlled to avoid damage to the Ga-face GaN-based material under the N-face GaN-based material.

Since the p-type GaN-based semiconductor layer 5 is a GaN-based material with N-face as an upper surface, and the barrier layer is a GaN-based material with Ga-face as an upper surface, the etching process may be easily controlled to avoid damage to the barrier layer during the process of etching the p-type GaN-based semiconductor layer 5.

Figure 4B:
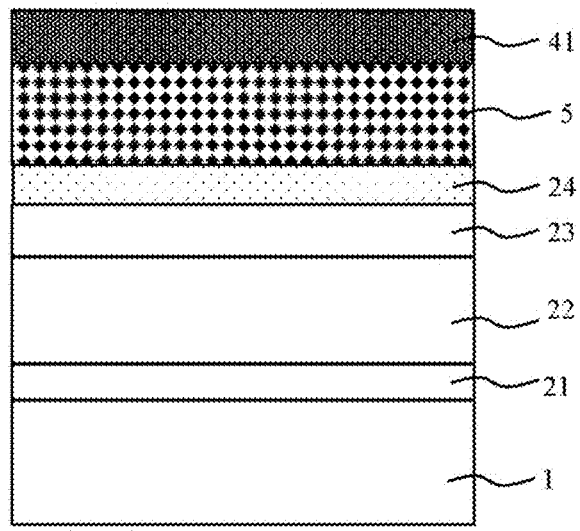
Figure 4C:
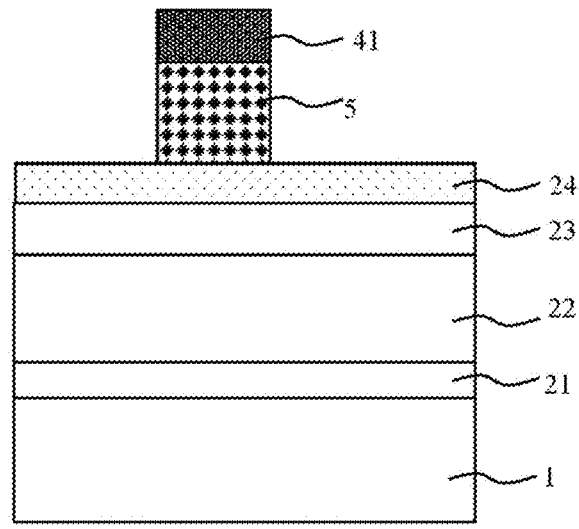

The selective etching of the p-type GaN-based semiconductor layer 5 may be specifically shown in FIGS. 4b-4c. First, a mask layer 41 is deposited on the p-type GaN-based semiconductor layer 5. The mask layer 41 may be a dielectric layer such as SiN, $SiO_2$, or a metal layer such as Ti, Ni, etc. Then selective etching is performed, and only the p-type GaN-based semiconductor layer 5 and the mask layer 41 in the gate region are retained. The mask layer 41 may play a good role in protecting the p-type GaN-based semiconductor layer 5 during the etching process. In this embodiment, the etching may be wet etching, or a combination of wet etching and dry etching to avoid excessive lateral etching reactions in the gate region during wet etching.

Figure 5A:
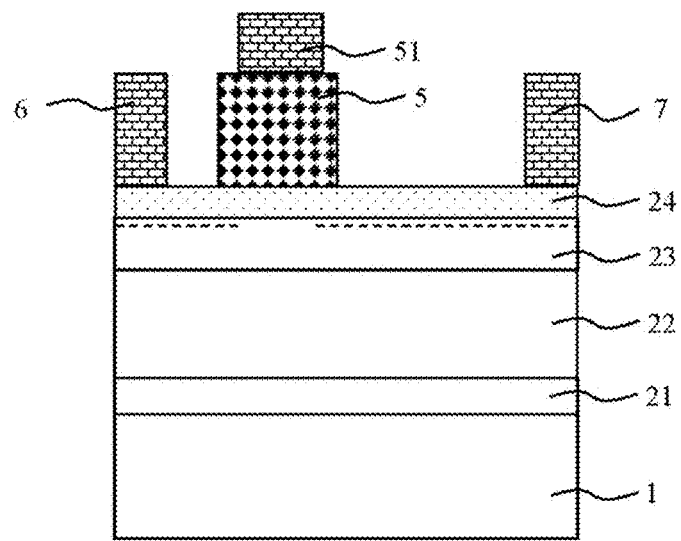

Step 604: as shown in FIG. 5a, preparing a gate electrode 51, a source electrode 6, and a drain electrode 7.

The gate electrode 51 is prepared on the p-type GaN-based semiconductor layer 5, the source electrode 6 is prepared in a source region of the barrier layer 24, and the drain electrode 7 is prepared in a drain region of the barrier layer 24.

The source region and the drain region in the present application are similar to the gate region in the present application, that is, regions used to prepare a source electrode and a drain electrode. It should be understood by those skilled in the art that the regions may be defined and determined according to a design and process of related devices.

It should also be understood that the source electrode 6, the drain electrode 7, and the electrode material 51 on the p-type GaN-based semiconductor layer 5 may be made of a metal material such as a nickel alloy, or may be made of a metal oxide or a semiconductor material. The present application does not limit the specific preparation materials of the source electrode 6, the drain electrode 7, and the electrode material 51 on the p-type GaN-based semiconductor layer 5.

Figure 5B:
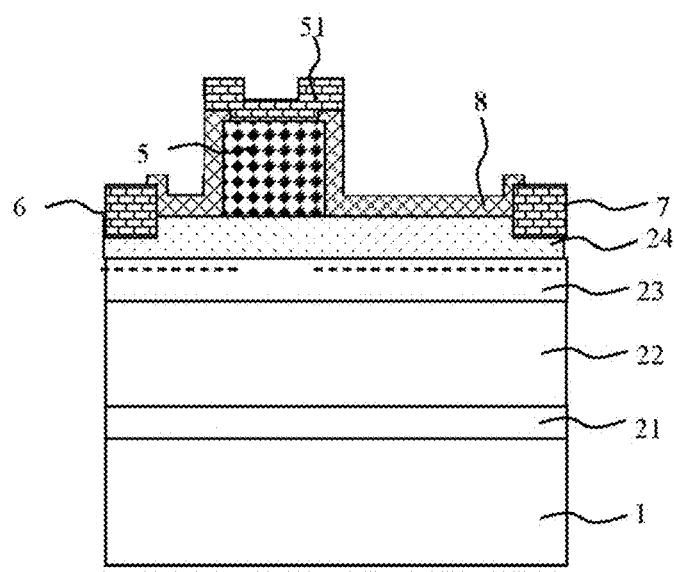

In an embodiment of the present application, as shown in FIG. 5b, when the electrode material 51 is to be prepared on the p-type GaN-based semiconductor material 5 to use as the gate electrode, firstly, a passivation layer 8 may be prepared on an exposed surface of the barrier layer 24. Then as shown in FIG. 5b, the electrode material 51 is prepared above the p-type GaN-based semiconductor material 5. The passivation layer 8 may be, for example, $Al_2O_3$, $SiO_2$, SiN, etc. The passivation layer 8 may protect the barrier layer 24 and avoid damage to the barrier layer 24.

Figure 6A:
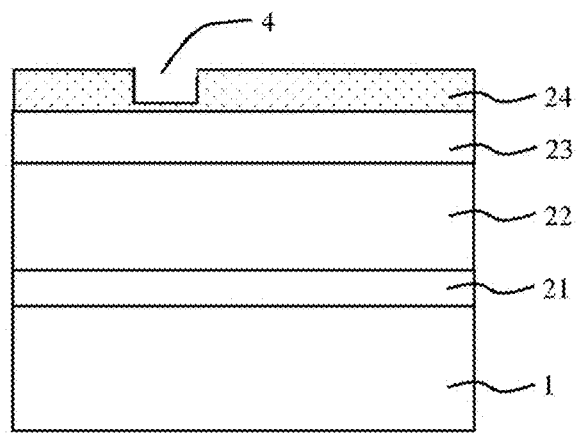
Figure 6B:
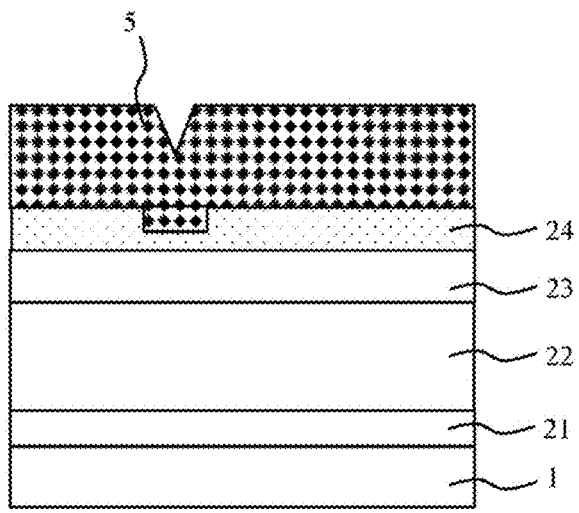
Figure 6C:
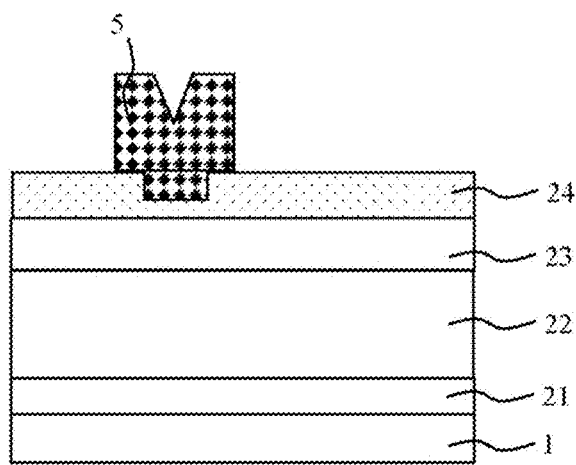
Figure 6D:
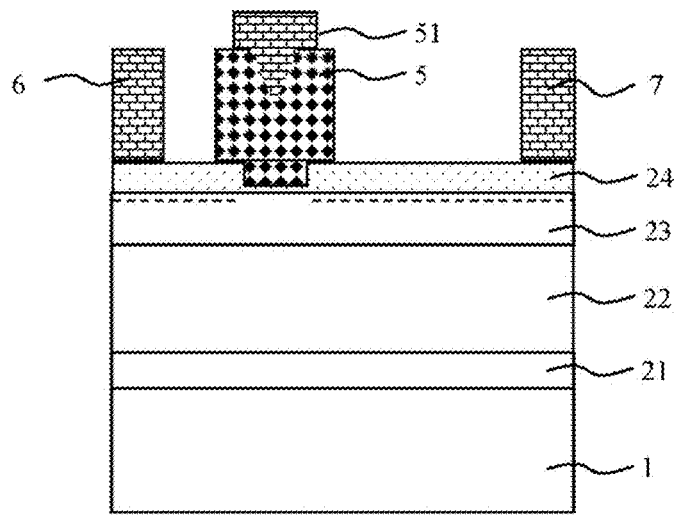

In an embodiment of the present application, as shown in FIG. 6a, in order to further improve the performance of the semiconductor structure and further reduce the two-dimensional electron gas density in the channel layer 23 under the gate region, a groove 4 may be provided in the gate region of the barrier layer 24 before preparing the p-type GaN-based semiconductor layer 5. The groove 4 may penetrate the barrier layer 24 to reach the channel layer 23, or it may stop in the barrier layer 24. As shown in FIG. 6b, after the groove 4 is formed, the p-type GaN-based semiconductor layer 5 is prepared above the barrier layer 24. Then, as shown in FIG. 6c, the p-type GaN-based semiconductor layer 5 is selectively etched, and only the p-type GaN-based semiconductor layer 5 in the gate region is retained. As shown in FIG. 6d, the gate electrode 51, the source electrode 6, and the drain electrode 7 are then prepared.

Figure 6E:
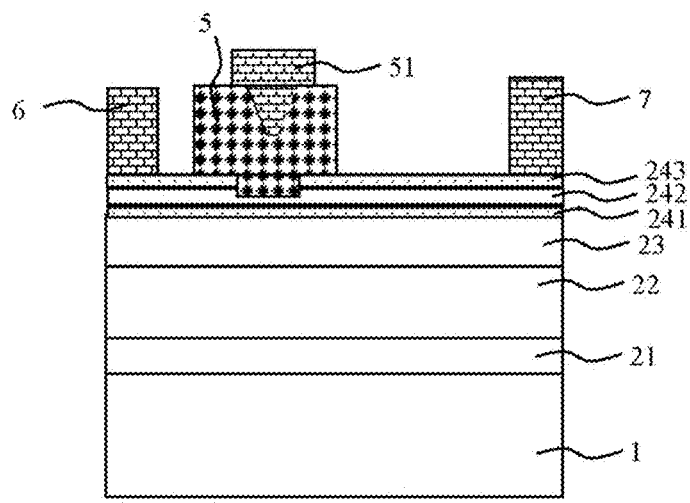

In an embodiment of the present application, the barrier layer 24 may adopt a sandwich structure. For example, as shown in FIG. 6e, the barrier layer 24 includes a first outer interlayer 241: AlGaN, an intermediate layer 242: GaN, and a second outer interlayer 243: AlGaN. The groove 4 may penetrate the second outer interlayer 243 of the sandwich structure of the barrier layer 24. At this time, the intermediate layer 242 may function as a stop layer in the local etching process for forming the groove 4 to protect the first outer interlayer 241 on a surface of the channel layer 23 from damage by the local etching process. However, the present application does not strictly limit a preparation depth of the groove 4, as long as the p-type GaN-based semiconductor layer 5 inside the groove 4 may pinch off an n-type conductive layer under the gate to achieve a semiconductor structure.

As shown in FIG. 5a, an embodiment of the present application also provides a semiconductor structure. The semiconductor structure includes: a substrate 1; a channel layer 23 and a barrier layer 24 sequentially superimposed on the substrate 1; and a p-type GaN-based semiconductor layer 5 formed in a gate region on the barrier layer 24. The barrier layer 24 is made of a GaN-based material, and an upper surface of the barrier layer 24 is Ga-face. The p-type GaN-based semiconductor layer 5 is made of a GaN-based material with N-face as an upper surface.

The substrate 1 may preferably be made of sapphire, diamond, silicon carbide, silicon, lithium niobate, Silicon on Insulator (SOI), gallium nitride or aluminum nitride.

The channel layer 23 and the barrier layer 24 may be made of semiconductor materials that may form a two-dimensional electron gas. For example, taking a GaN-based material as an example, the channel layer 23 may be made of GaN, the barrier layer 24 may be made of AlGaN or AlInGaN, and the channel layer 23 and the barrier layer 24 form a heterostructure to form a two-dimensional electron gas.

In an embodiment, the p-type GaN-based semiconductor layer 5 may be made of, for example, a multilayer structure or a superlattice structure including one or more materials of p-type AlGaN, p-type GaN, and p-type InGaN.

In a further embodiment of the present application, as shown in FIG. 5a, in order to improve device performances and meet related technical requirements, the semiconductor structure may further include a nucleation layer 21 and a buffer layer 22 provided under the channel layer 23. Taking a GaN-based semiconductor structure as an example, in order to meet technical requirements such as reducing dislocation density and defect density, and improving crystal quality, a nucleation layer 21 prepared above the substrate 1 may be further included. The nucleation layer 21 may be made of one or more of AlN, AlGaN and GaN. In addition, in order to buffer a stress in an epitaxial structure above the substrate and prevent the epitaxial structure from cracking, the GaN-based semiconductor structure may further include a buffer layer 22 prepared above the nucleation layer 21. The buffer layer 22 may be made of one or more of GaN, AlGaN, and AlInGaN.

In an embodiment of the present application, as shown in FIG. 5a, the semiconductor structure further includes: a source electrode 6 disposed in a source region of the barrier layer 24, a drain electrode 7 disposed in a drain region of the barrier layer 24, and a gate electrode 51 disposed on the p-type GaN-based semiconductor layer. The source electrode 6, the drain electrode 7, and the gate electrode 51 may be made of a conductive metal material such as a nickel alloy, or may be made of a metal oxide or a semiconductor material. The present application does not limit the specific preparation materials of the source electrode 6, the drain electrode 7, and the electrode material 51 on the p-type GaN-based semiconductor layer 5.

In an embodiment of the present application, as shown in FIG. 6d, in order to further improve the performance of the semiconductor structure and further reduce the two-dimensional electron gas density in the channel layer 23 under the gate region, the semiconductor structure may further include a groove 4 disposed in the gate region of the barrier layer 24. However, it should be understood that the semiconductor structure may not include the groove 4, and the p-type GaN-based semiconductor layer 5 may be directly prepared in the gate region, considering that the purpose of pinching off an n-type conductive layer under the gate may be achieved as long as the p-type GaN-based semiconductor layer 5 is prepared in the gate region.

In an embodiment of the present application, as shown in FIG. 6e, when the semiconductor structure includes the groove 4, the barrier layer 24 may also adopt a sandwich structure. The sandwich structure includes a first outer interlayer 241 prepared on a surface of the channel layer 23, an intermediate layer 242 sandwiched between the first outer interlayer 241 and a second outer interlayer 243, and the second outer interlayer 243. It should be understood that the materials of the first outer interlayer 241, the intermediate layer 242, and the second outer interlayer 243 may be adjusted according to the material of the channel layer 23. For example, taking a GaN-based material as an example, when the channel layer 23 is made of GaN, the first outer interlayer 241 and the second outer interlayer 243 may be made of AlGaN, and the intermediate layer 242 may be made of GaN. However, the present application does not specifically limit the materials of the first outer interlayer 241, the intermediate layer 242, and the second outer interlayer 243.

It should be understood that although this specification is described according to embodiments, not each embodiment only includes one independent technical solution. The way of describing is only for clarity purpose, and those skilled in the art should deem the specification as a whole. The technical solutions in each embodiment may also be appropriately combined to form other embodiments that may be understood by those skilled in the art.

The series of detailed descriptions listed above are only specific descriptions of feasible embodiments of the present application. They are not intended to limit the protection scope of the present application. Any equivalent embodiments or modifications made within the technical spirit of the present application shall be included in the protection scope of the present application.

What is claimed is:

1. A semiconductor structure, comprising:
a substrate;
a channel layer and a barrier layer sequentially superimposed on the substrate, wherein the channel layer and the barrier layer are made of GaN-based materials and an upper surface of the barrier layer is Ga-face; and
a p-type GaN-based semiconductor layer formed in a gate region of the barrier layer, wherein an upper surface of the p-type GaN-based semiconductor layer is N-face.

2. The semiconductor structure according to claim 1, further comprising:
a gate electrode disposed on the p-type GaN-based semiconductor layer;
a source electrode disposed in a source region of the barrier layer; and
a drain electrode disposed in a drain region of the barrier layer.

3. The semiconductor structure according to claim 1, further comprising:
a nucleation layer between the channel layer and the substrate; and
a buffer layer between the nucleation layer and the channel layer.

4. The semiconductor structure according to claim 1, wherein the p-type GaN-based semiconductor layer comprises a multilayer structure or a superlattice structure comprising one or more materials of p-type AlGaN, p-type GaN, and p-type InGaN.

5. The semiconductor structure according to claim 1, further comprising a groove disposed in the gate region of the barrier layer, wherein the groove penetrates the barrier layer and stops on the channel layer or partially penetrates the barrier layer and stops in the barrier layer.

6. A manufacturing method for a semiconductor structure, comprising:
preparing a channel layer and a barrier layer sequentially superimposed on a substrate, wherein the channel layer and the barrier layer are made of GaN-based materials and an upper surface of the barrier layer is Ga-face; and
preparing a p-type GaN-based semiconductor layer with N-face as an upper surface above the barrier layer.

7. The manufacturing method for a semiconductor structure according to claim 6, wherein the preparing a p-type GaN-based semiconductor layer with N-face as an upper surface above the barrier layer, comprises:
preparing a p-type Ga-face GaN-based material above the barrier layer, and doping a polarity reversal element in the p-type Ga-face GaN-based material to reverse the p-type Ga-face GaN-based material to the p-type GaN-based semiconductor layer with N-face as an upper surface.

8. The manufacturing method for a semiconductor structure according to claim 7, wherein the polarity reversal element comprises Mg.

9. The manufacturing method for a semiconductor structure according to claim 6, wherein the preparing a p-type GaN-based semiconductor layer with N-face as an upper surface above the barrier layer, comprises:
preparing a p-type Ga-face GaN-based material above the barrier layer; and
reversing the p-type Ga-face GaN-based material by a polarity reversal layer to the p-type GaN-based semiconductor layer with N-face as an upper surface.

10. The manufacturing method for a semiconductor structure according to claim 6, wherein the preparing a p-type GaN-based semiconductor layer with N-face as an upper surface above the barrier layer, comprises:
bonding the p-type GaN-based semiconductor layer with N-face as an upper surface to the barrier layer directly.

11. The manufacturing method for a semiconductor structure according to claim 6, further comprising:
etching the p-type GaN-based semiconductor layer selectively, and reserving only a portion of the p-type GaN-based semiconductor layer corresponding to a gate region.

12. The manufacturing method for a semiconductor structure according to claim 6, further comprising:
preparing a gate electrode on the p-type GaN-based semiconductor layer, preparing a source electrode in a source region of the barrier layer, and preparing a drain electrode in a drain region of the barrier layer.

13. The manufacturing method for a semiconductor structure according to claim 6, further comprising:
forming a nucleation layer and a buffer layer on the substrate sequentially before forming the channel layer.

14. The manufacturing method for a semiconductor structure according to claim 6, before the preparing a p-type GaN-based semiconductor layer with an N-face as an upper surface above the barrier layer, further comprising: preparing a groove in a gate region of the barrier layer, wherein the groove penetrates the barrier layer and stops on the channel layer or partially penetrates the barrier layer and stops in the barrier layer.

* * * * *